United States Patent [19]
Bognár et al.

[11] Patent Number: 5,150,059
[45] Date of Patent: Sep. 22, 1992

[54] METHOD AND APPARATUS FOR TESTING THE CONDITION OF INSULATING SYSTEM

[75] Inventors: Alajos Bognár; Gusztáv Csépes; István Hámos, all of Budapest, Hungary

[73] Assignee: B & C Diagnostics Kft., Budapest, Hungary

[21] Appl. No.: 610,406

[22] Filed: Nov. 7, 1990

[30] Foreign Application Priority Data

Nov. 9, 1989 [HU] Hungary ............................. 5843/89

[51] Int. Cl.$^5$ ............................................. G01R 31/12
[52] U.S. Cl. ...................................... 324/551; 324/546
[58] Field of Search ............... 324/551, 546, 547, 541, 324/544, 553; 340/647

[56] References Cited

U.S. PATENT DOCUMENTS

| | | | |
|---|---|---|---|
| 3,753,087 | 8/1973 | Tan | 324/551 |
| 4,117,397 | 9/1978 | Fukao et al. | 324/518 |
| 4,845,737 | 7/1989 | Ohlendorf et al. | 324/541 |
| 5,032,826 | 7/1991 | Miller et al. | 340/647 |

FOREIGN PATENT DOCUMENTS

| | | | |
|---|---|---|---|
| 28655 | 2/1987 | Japan | 324/551 |
| 154974 | 6/1988 | Japan | 324/551 |
| 1140062 | 2/1985 | U.S.S.R. | 324/551 |
| 383229 | 3/1988 | U.S.S.R. | 324/551 |
| 2217836 | 11/1989 | United Kingdom | 324/551 |

OTHER PUBLICATIONS

Japanese Journal of Applied Physics Yoshino et al. Sep. 1982.
Japanese Journal of Applied Physics Yamanaka et al. Jun. 1984.
Electronics Test A. O. Reynolds Mar. 1989.
IEEE proceedings vol. 132 Nov. 1985 Shroff.
Cigre Symposium Pomun et al. May 1987.

Primary Examiner—Jack B. Harvey
Assistant Examiner—Maura K. Regan
Attorney, Agent, or Firm—Schweitzer Cornman & Gross

[57] ABSTRACT

The present invention is a method and apparatus for testing the condition of insulating systems. The insulating system is charged up by a dc voltage and then discharged. The return voltage appearing after discharge is assessed and the quotient of the peak value of the return voltage and the charging voltage is measured. According to the invention the charging is done in time-interval of $10^{-3}-10^4$ seconds, with a ratio of charging to discharging time in the range of 0.1—100. The measurement cycle is repeated several times with other charging/discharging times, but with the same charge/discharge ratio. The resulting spectrum of values may be compared with a reference whereby the state of the insulating system can be assessed. An apparatus for implementing the method the apparatus for implementing the said method consists of a high voltage source, a switching circuit and voltage measuring units.

9 Claims, 6 Drawing Sheets

METHOD AND APPARATUS FOR TESTING THE CONDITION OF INSULATING SYSTEM

The subject of the present invention is a method for testing the condition of the insulation of an electrical system or a piece of electrical equipment, in which the system is charged by direct current through conducting parts which are insulated from each other. The system is then discharged. After discharge the condition of the insulation may be determined from consideration of the parameters of the return voltage.

A further subject of the present invention is the apparatus for performing such tests, which comprises a high voltage source, voltage measuring devices, and asscoiated switching circuits.

BACKGROUND OF THE INVENTION

Information gained from the determination of the condition of insulation of an electrical circuit is of principal importance. As system reliability is related to the condition of the insulation, insulation conditions can determine the reliability of the complete electrical system. The condition of electrical insulation can be determined by measuring different physical, electrical, and chemical characteristics. These characteristics are subject to change as a consequence of service stresses on the insulation. The measure of such changes allows conclusions to be drawn as to the condition and performance of the insulation.

The total form of insulation of a piece of electrical equipment or system may be called its insulating system. The deterioration of an insulating system can be of two different types:

1. A local deterioration or failure; and
2. A general deterioration, spread over the bulk of the insulating system.

With respect to general deterioration of an insulation system, the detection of two types of changes to the system is of great importance. These changes are:

a) moistening of the insulation; and
b) accumulation of by-products developed by insulation deterioration at high temperature.

As between the two, moistening is especially significant. According to the results of research reported in *IEE Proceedings*, Vol. 132, Pt. 6 No. 6 (1986) p. 312–319, by D. H. Shroff and D. H.-A. W. Stannett, review of the aging of paper insulation in power transformers indicates that where a 2% humidity increase is experienced, the lifetime of such oil-paper insulating systems will be decreased to $1/20^{th}$ of the dry insulation life.

Known prophylactic test processes for insulating systems are directed to determination of insulation resistance, the absorption factor, and the loss tangent of the system. The theoretical basis for such tests, and the first test apparatus, were developed more than 70 years ago. Although the design of testing apparatus has been brought up to date because of improvements in the implementing electronic circuitry, the information gained from such tests are of limited use.

The measurement of insulation resistance is one of the oldest insulation test methods. The advantage of this method is the simple procedure in carrying out the test, while its disadvantage is the rather low information content of the test results. The insulation resistance value is influenced not only by the aforementioned changes in the insulation, but also by numerous other parameters, among these the geometric dimensions of equipment or system under test. In addition, the relationship between insulation resistance and moisture and deterioration is not unambiguous; significant change in resistance is generally caused only be a great deterioration. Further, test results can be significantly influenced by the condition of the external insulation which affects the simplicity of the testing process as well.

The introduction of the absorption coefficient $K_A$, a ratio of system resistance at two elapsed times after the application of a DC voltage, was promoted by two factors: 1) demand for a characteristic not depending on the geometric size of the test subject; and 2) experience which indicated that insulation resistance is dependent on the time of voltage application. Such a test typically uses a time ratio of 60 to 10, i.e. $K_A = R_{60}/R_{10}$, and the value of the measured insulation resistance is influenced by the polarization phenomena developed in the insulating system.

The evaluation of the absorption coefficient follows a rule of thumb: if the value of $K_A$ is between 2 and 2.5, then the condition of the insulating system can be regarded as good. If it is about 1 then the condition is regarded as bad. According to the investigations of the present inventors, the relationship between the absorption coefficient and the condition of the insulating system cannot be assessed so simply. This can be seen in FIG. 1, where $K_A = R_{60}/R_{10}$ is plotted against the humidity content of an oil-paper insulating system at different temperatures. The validity of the general assessment mentioned above can be strongly debated, as the absorption coefficient does not change monotonically as a function of humidity content. The disadvantage of even this improved method is that, because the superimposition of conduction and polarization phenomena is measured, its sensitivity is rather limited.

The determination of the loss factor or tangent (tan $\delta$) has been used for more than 60 years for assessing the condition of electrical insulation in service. The value of the loss tangent is influenced by insulation losses of both the conduction and polarization character. The sensitivity of the loss tangent to certain polarization phenomena is primarily influenced by the frequency of the test voltage applied. Processes taking place during the aging of an insulation system have a strong influence on long time-constant polarization phenomena. As a result, tests carried out at a voltage of very low frequency (VLF) are the most sensitive, but practical on-site methods and apparatus for such VLF loss factor tests have not yet been developed. With loss tangent tests at industrial frequencies, significant resistance changes can be detected only in the case of a very greatly deteriorated insulating system. It is to be mentioned that on-site testing of loss tangent is a rather complicated testing process as strong electrical fields, present for example, in high voltage substations, have a disturbing effect on the test.

These traditional methods of insulation testing are of extremely limited usefulness because they characterize the condition of a perhaps very complicated insulating system by only one figure, which is of course not sufficient, and which is subject to qualification.

In spite of these facts, even with present testing techniques, only the above-mentioned methods are used for testing of electrical equipment in service. See, for example, the reported test results on 132 KV transformers in the United Kingdom in Domun-Cornfeld-Hadfield, Prediction of Remaining Lives of 132 kV Grid Transformers, *CIGRE Symposium*, Section 10.2, No 1020-08, (Vienna, May 1987).

The phenomena by which, after charging up by a direct current or voltage and subsequent discharging a return voltage appears, has been known for a long time as the electrical after-effect. See, for example, Andras Csernatony-Hoffer and Tibor Horvath, *High Voltage Engineering*(Tankonyvkiado, 1986) p. 260–65. In practical importance apparatus and equipment of high capacitance which are charged up by DC then switched off have to be practically short-circuited for a long time period, if not constantly. The electrical after-effect and the return voltage so developed contain information on the state of system insulation, as referred to in the literature along with its theoretical explanation.

The parameters of return voltage can give complete and full information on the state of insulation if the broad spectrum of polarization phenomena having long time-constants can be determined.

It is known that, with respect to certain values of charging and discharging times, a certain group of elementary polarization processes, characterized by their band of time-constants, can be activated. No test method and test apparatus were formerly known, however, for the broad implementation of such determination.

Thus, a purpose of the present invention is to provide a test methodology for the determination of polarization spectra in the domain of space charge polarization phenomena having long time-constants which would have an unambiguous relationship to the state and change of state of an insulating system by the evaluation of return voltage parameters appearing after charging the insulating system by a DC voltage and discharging it for a certain length of time.

A further purpose of the present invention is to provide a testing apparatus for implementing the test method.

BRIEF DESCRIPTION OF THE INVENTION

The above purposes have been achieved by a method according to the present invention in which charging of the system by direct current is made in a time interval of $10^{-3}$ to $10^4$ seconds and the ratio of charging and discharging times is selected to be in the range of 0.1 to 100. The quotient of the peak value of the return voltage and the charging voltage is determined. The test process is repeated several times using other charging /discharging time values, but with the same ratio of charging/discharging times. In this way a spectrum of the voltage quotients plotted against charging time can be determined and the condition of the insulating system can be assessed by comparing the obtained spectrum with a reference.

The advantage of the present method is the ability to use a broad time interval, whereby the entire polarization domain having a long time-constant and which is relevant in detecting the deterioration of insulating systems can be activated. In addition, by the proper selection of the ratio of charging and discharging times necessary determination can be reached.

It has been determined that there is an unambiguous relationship between the shape of the polarization spectrum as determined by the peak values of return voltage and the humidity content of the insulating system under test.

It has been further determined that the spectrum of an insulating system in a first state, determined by the procedure of the present invention, can be regarded as a reference, this spectrum being modified by changes resulting from the aging of the insulation.

In an advantageous implementation of the method of the present invention, the initial slope of the return voltage is determined as a function of charging time and a spectrum drawn up, such that the state of the insulating system can be further assessed by comparing the spectrum with a reference spectrum. It has been determined that the initial slope spectrum is able to characterize the state of the insulating system and is able to reflect changes influencing polarization phenomena of long time-constants.

In order to measure the initial slope with low error by suppressing main frequency disturbances, a further advantageous implementation of the present method determines the initial slope by voltage sampling, in which the sampling cycle time is equal to the cycle time of the alternating current (AC) mains or to an integer multiple thereof.

Any of the implementations of the method according to the present invention can be further carried out by measuring the charging current as a function of time after the application of the DC charging voltage. In this way the time-function of insulation resistance can be determined. The advantage of this method of implementation is to obtain another insulation characteristic by the same testing process. In particular, the absorption coefficient $K_A$ can be calculated, the determination of which is prescribed in several standards.

The implementation of the method of the present invention is through the following apparatus: One terminal of a high voltage source and measurement unit is connected directly to one of the electrodes of the insulating system. The second terminal is connected through at least two switches in series to the other electrode of the insulating system. A first shorting switch is inserted between the common point of the series switches and the first terminal of the high voltage source/measuring connector. A first terminal of a return voltage measurement unit is connected to the first terminal of the high voltage source and measurement unit. The other terminal of the return voltage measuring unit is connected to the second electrode through at least one series switch. In addition, a second shorting switch is connected in parallel with the return voltage measurement unit.

The advantages of this apparatus are its compact design and easy handling. The first shorting switch makes it possible to eliminate the effects of occasional leakage of both series switches between which it is connected.

In a further advantageous embodiment of the apparatus according to the present invention, the connection between the second measuring terminal and the corresponding electrode of the insulating system to be tested is made through the inner lead of a double shielded cable. The return voltage measuring unit is an electrometer circuit, one output of which is connected to the inner shield of the double shielded cable through a series switch, while the outer shield of the cable is connected to earth potential or ground. By this arrangement errors caused by the capacity and leakage of the connection between the measuring set and the test object can be eliminated.

In a further advantageous embodiment of the apparatus according to the present invention a switch is connected between the inner lead and the inner shield of the cable. In addition, the input resistance of the return voltage meter unit is at least $2 \times 10^{13}$ ohm. As a consequence of these measures, the effects of the connecting lead are realized only during the measuring time, and the high input resistance increases the accuracy of testing.

In yet another advantageous embodiment of the apparatus according to the present invention, a current measuring unit is inserted between the high voltage source and one of the measuring terminals. By this means the additional ability to measure the insulation resistance as a function of time is provided, thereby allowing the absorption coefficient to be determined.

In still a further advantageous embodiment of the apparatus, the switches are of solid state design. By using such switching the drawbacks of mechanical switches, such as dead time, spring back contacts, and the like can be eliminated.

BRIEF DESCRIPTION OF THE DRAWINGS

A better understanding of the method and apparatus of the present invention will be obtained by consideration of the following detailed description and the annexed drawings, wherein.

DETAILED DESCRIPTION OF THE INVENTION

Figure 1:
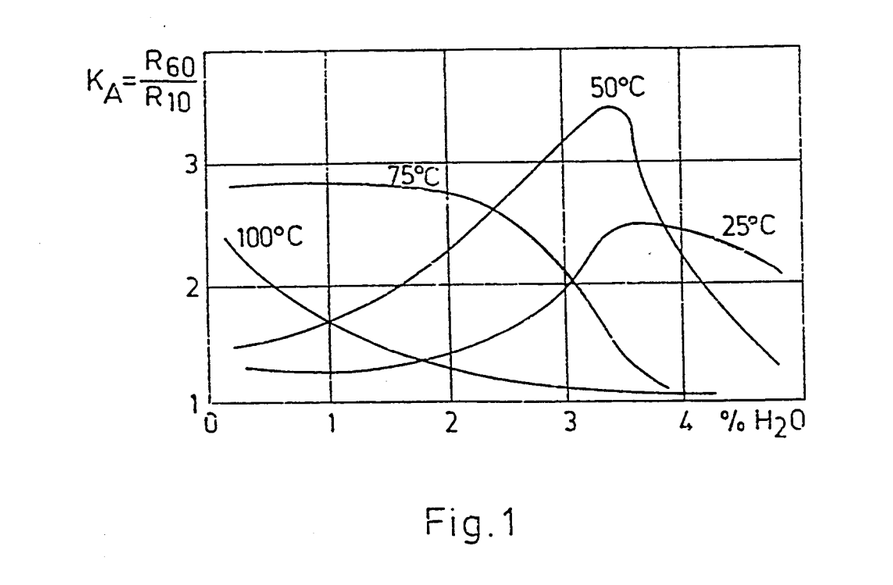
FIG. 1 illustrates the change of the absorption coefficient $K_A = R_{60}/R_{10}$ as a function of the humidity content of the paper and temperature in the case of an oil-paper insulating system.

The study of the $K_A$ absorption coefficient of insulating paper at different humidity contents and temperatures as presented in FIG. 1 shows that the frequently used $K_A$ measurement does not give unambiguous indication of the condition of the insulating system. The changes of $K_A$ as a function of insulation humidity content and temperature are not of a monotonic character.

Figure 2:
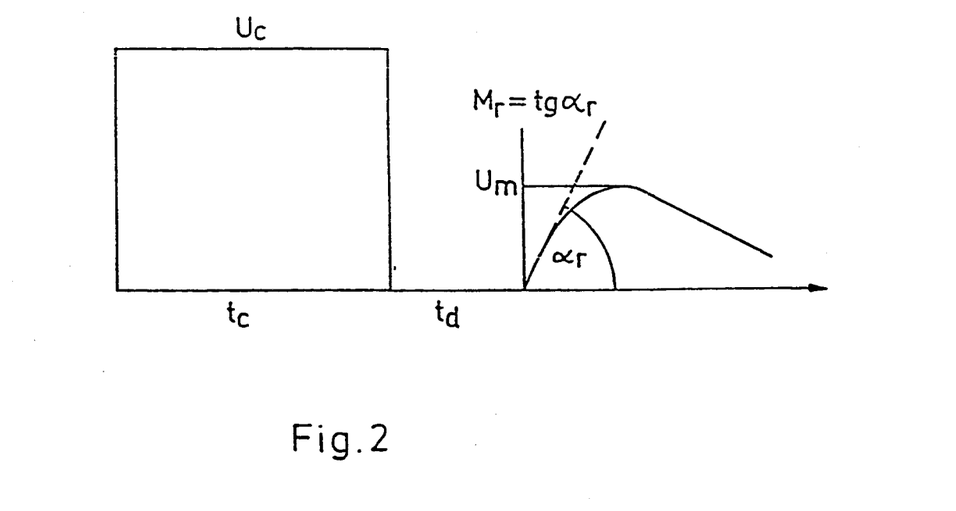
FIG. 2 illustrates charging of a system with a DC voltage $U_c$ for a time of $t_c$, followed by a discharge for a time of $t_d$, and the time-function of the resulting return voltage.
Figure 3:
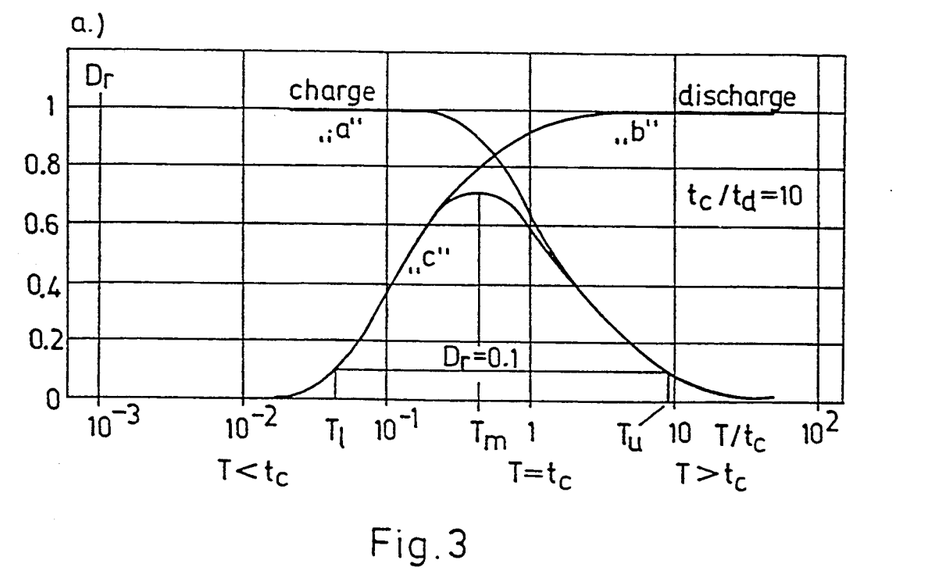
FIG. 3 depicts the dependence of the ratio $D_r$ of the development of elementary polarization processes, characterized by a time constant T, from the charging time $t_c$ and the discharging time $t_d$.
Figure 4:
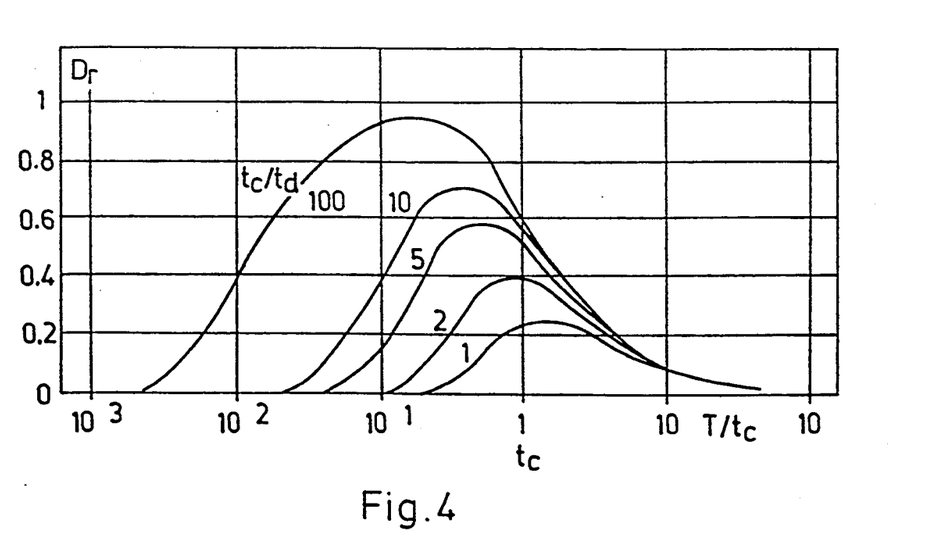
FIG. 4 depicts, for the various $t_c/t_d$ ratios, the magnitude of elementary polarization processes characterized by a time constant T as a function of charging time.

FIGS. 2, 3, and 4 show the basic principles of return voltage testing and measurement. FIG. 2 presents the basic concepts. As shown therein, a charging voltage $U_c$ is applied for a time $t_c$, followed by a discharge period $t_d$. A return voltage is subsequently developed, reaching a maximum $U_m$. The tangent of the slope $\alpha_r$ of the voltage is denoted as $M_r$.

In FIG. 3 curve "a" shows the development ratio $D_r$ of the elementary polarization processes, characterized by time-constants T, which are activated in a charging time interval of $t_c$ presented in FIG. 2. It can be seen that, in the case of $T < t_c$, the polarization processes are practically totally developed ($D_r = 1$). Thus, in the case of $T = 0.45 t_c$, the $D_r$ is 0.9. Where $T > t_c$, development is small; in the case of $T = 10 t_c$ the $D_r$ is 0.1.

Curve "b" of FIG. 3 shows the typical regression of development ratios associated with polarization processes of time constant T during the short circuit period $t_d$ of FIG. 2. Lastly, curve "c" of FIG. 3 shows the resultant degree of development $D_r$ of the elementary polarization processes in the activated state.

FIG. 4 shows the relationship between the selection of charge/discharge time ratio $t_c/t_d$ and the activation of the elementary polarization processes after charging, that is, when the return voltage develops. It can be seen in FIG. 4, that the selection of $t_c/t_d$ is a compromise between the sensitivity of return voltage measurement and the selectivity requirement of the determination of the individual polarization ranges.

The range of $t_c/t_d = 0.1$ to 100 includes the practical cases. By selecting $t_c/t_d = 2$, the $T_m$ (principal or central time constant) would be equal to $t_c$, that is, the central time-constant would be the same as the charging time. At other $t_c/t_d$ values $T_m$ would be $T_m = kt_c$, where the value of k is determined by the center of gravity of the area under the curve "c" in FIG. 3.

Figure 5:
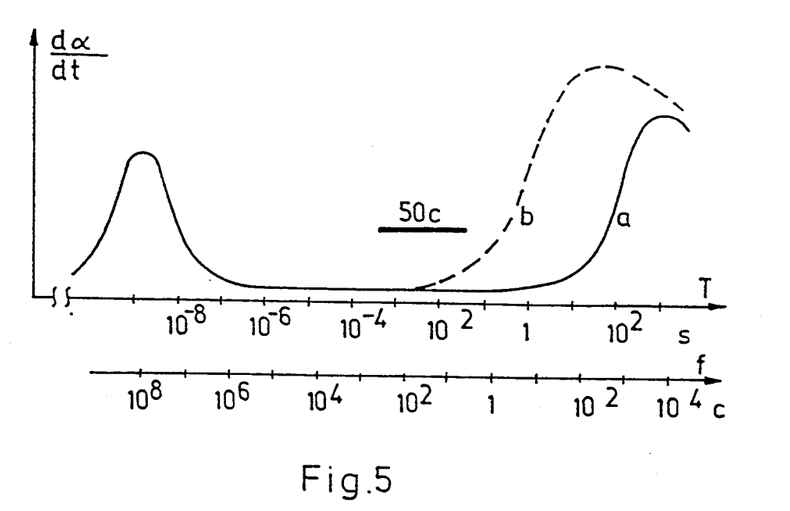
FIG. 5 shows the polarization spectra of a new oil-paper insulation system (a) and as aged (b)

FIG. 5 illustrates that the polarization spectrum of oil-paper insulating systems is shifted towards the region which can be tested by DC and low frequency AC voltages upon aging of the insulating system. It can be said that the interval about 50 Hz would only be activated by very badly aged insulating systems. This is the reason for low diagnostic sensitivity of tan $\delta$ measurement at 50 Hz. FIG. 5 also shows that the time-constant range of $10^{-3}$ to $10^4$ seconds would include, with a great margin of safety, all changes generated by aging.

Figure 6:
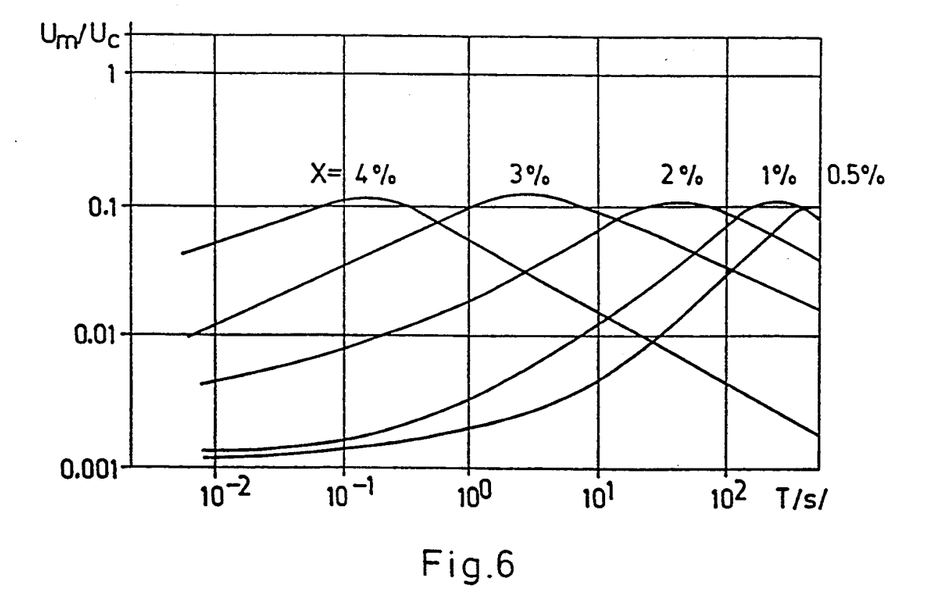
FIG. 6 shows the ratio of the return voltage peak value $U_m$ to charging voltage $U_c$ as a function of the time constant T at various insulating paper humidity levels, for an oil-paper insulating system.

FIG. 6 summarizes test results as determined by the test method of the present invention. It can be seen in FIG. 6 that the variation of humidity content from 0.5% to 4.0% results in an unambiguous change of the spectra. The dominant time-constant T ($\Delta$), which corresponds to the peak value of $U_m/U_c$, changes more than 3 orders of magnitude in the humidity content range of 0.5-4%.

The present testing method thus provides a sensitive and reliable response to the aging of insulating systems. A 0.5% humidity content and the respective dominant central time-constant of about 500 seconds characterize a good insulating system. The operation of an insulation system with more than a 3% humidity content, having a dominant central time-constant of less than 1 second is problematical; the risk of breakdown exists. At humidity contents below 1-1.5% there is no significant polarization by the humidity content in the time region of 0.01 to 100 seconds. In such a case, the accumulation of the aging products can be monitored by the changing of the central time-constants.

Figure 7:
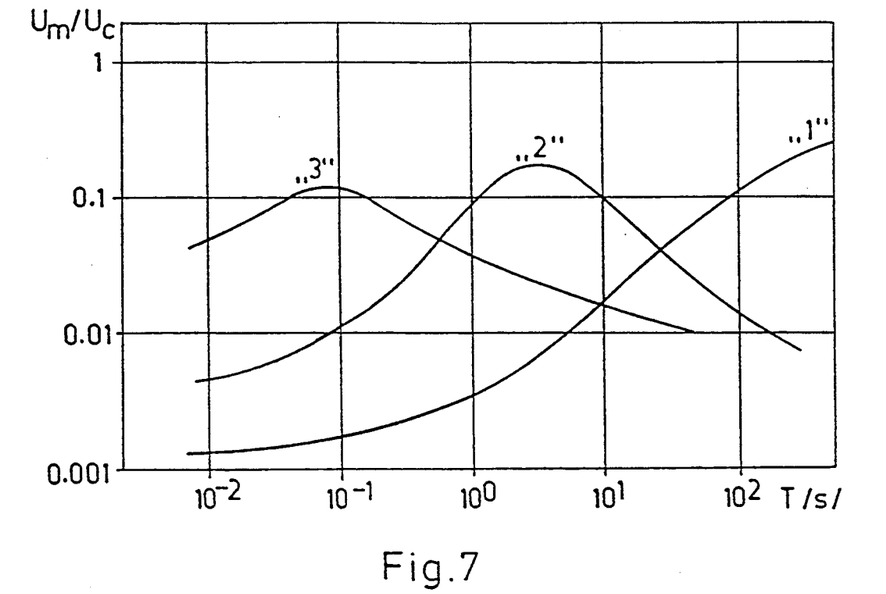
FIG. 7 shows the return voltage peak $U_m$/charging voltage $U_c$ ratio spectra as measured on high voltage transformers of various ages with differently aged oil-paper insulating systems.

FIG. 7 further shows the usefulness of the procedure according to the present invention. Spectrum "1" in FIG. 7 was measured on a new 765/420 kV transformer. Curve 2 is a spectrum of a 15-year old 120/20 kV transformer. The central time constant shows, with regard to the information set forth in FIG. 6, a 3% humidity content. Accordingly, this transformer would require an oil treatment to reduce the humidity content. Curve 3 shows an aged transformer, the dominant central time-constant being less than 0.1 seconds indicating a humidity content of more than 4%. It was only at nominal voltages, and an operating temperature mainly under 40° C. that this unit could have been operated.

Figure 8:
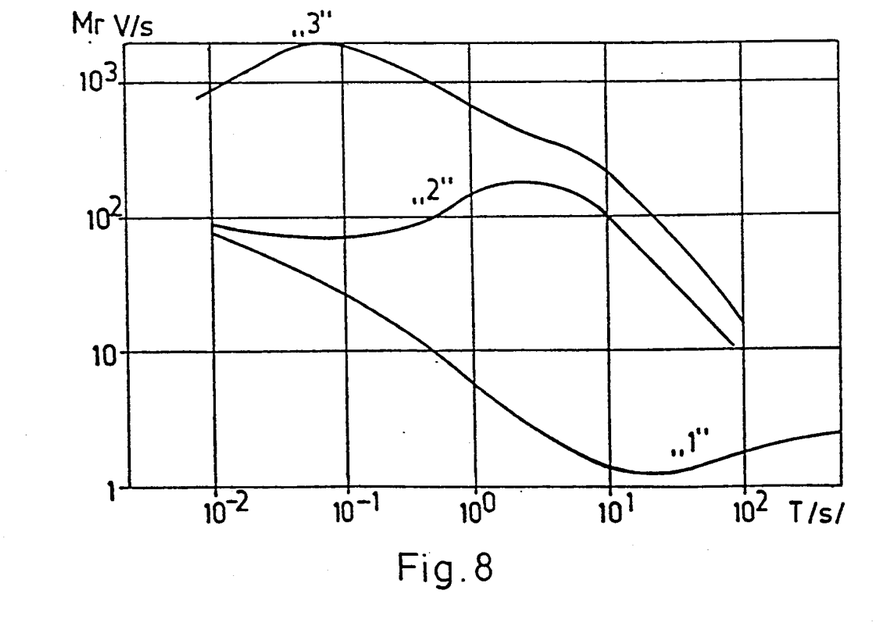
FIG. 8 depicts the spectra of the initial slope of the return voltage $M_r = \tan \alpha_r$, measured on the transformers of FIG. 7.

FIG. 8 provides, for the three transformers of FIG. 7, the spectra for the initial slopes of the return voltages $M_r = \tan \alpha_r$ as defined in FIG. 2. The conclusions from FIG. 7 are also valid for FIG. 8.

Figure 9:
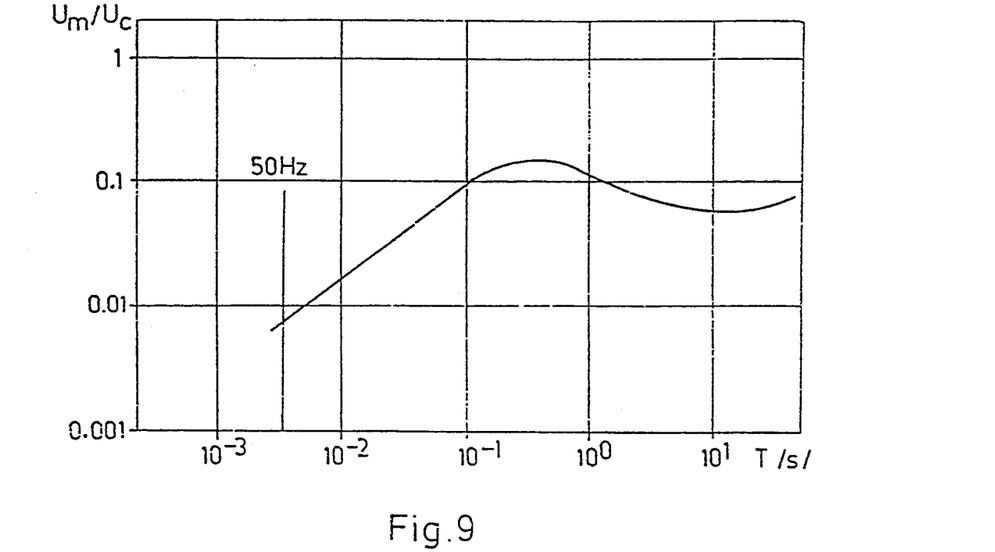
FIG. 9 depicts the return voltage peak value $U_m$/charging voltage $U_c$ ratio spectrum for a high voltage transformer oil-paper insulation system after a breakdown.

FIG. 9 provides the results of measurements on a 120/20 kV transformer that had a breakdown during operation at a temperature of 60° C. The measurements were carried out at temperature of 20° C. The dominant central time-constant measured at 60° C. would be about one order of magnitude less than at 20° C. It would therefore approach the time interval which determines the dielectric losses at 50 Hz.

Figure 10:
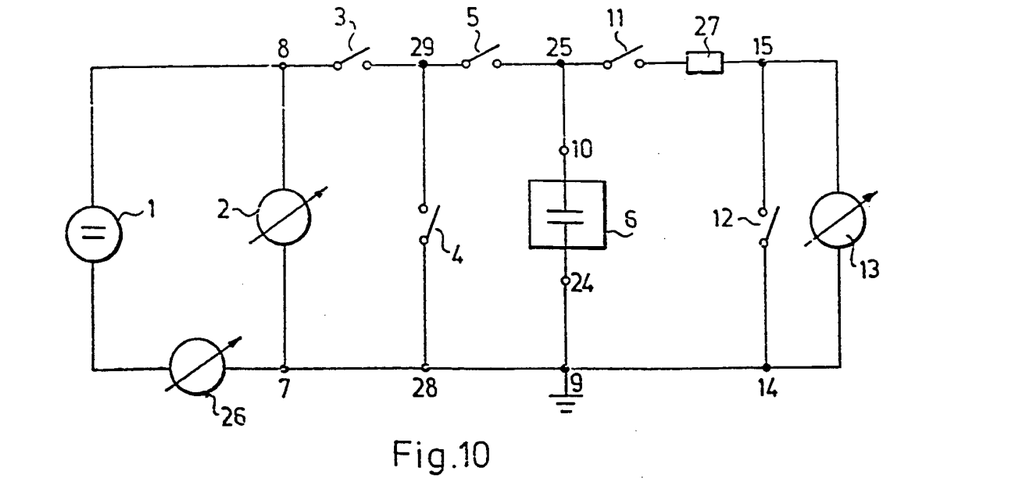
FIG. 10. is a schematic diagram of a test apparatus of the present invention.

FIG. 10 shows a circuit diagram for an apparatus for carrying out the present method, wherein the testing apparatus consists of a high voltage source 1, voltmeters 2 and 13, an ammeter 26, a switching network having the switch elements 3, 4, 5, 11 and 12, and the system to be tested, which is represented by the capacitor 6.

One terminal 7 of the high voltage source 1 and meter system 2,26 connects to terminal 9 of the terminals of the testing apparatus, which is directly connected to electrode 24 of the tested insulating system 6. The other source terminal 8 is connected to the two switches 3,5 which are in series with the other measuring terminal 25 to which the other electrode 10 of the tested insulating system 6 is connected. A switch 4 is inserted in a shunting relation across the voltage source, one side connected to the common point 29 of series switches 3,5, the other side connected to the line of source terminal 7. The return voltage measuring unit or voltmeter has terminal 14 connected to testing apparatus terminal 9, its other terminal 15 being connected through series switch 11 to the other terminal 25. Series resistor 27 provides current limiting. A shunting switch 12 is placed in parallel with the return voltage measuring unit 13. In one possible design, the switches may be operated by electromagnets, for example, the switches being high voltage reed relays. In another design, they can be solid state switches.

Figure 11:
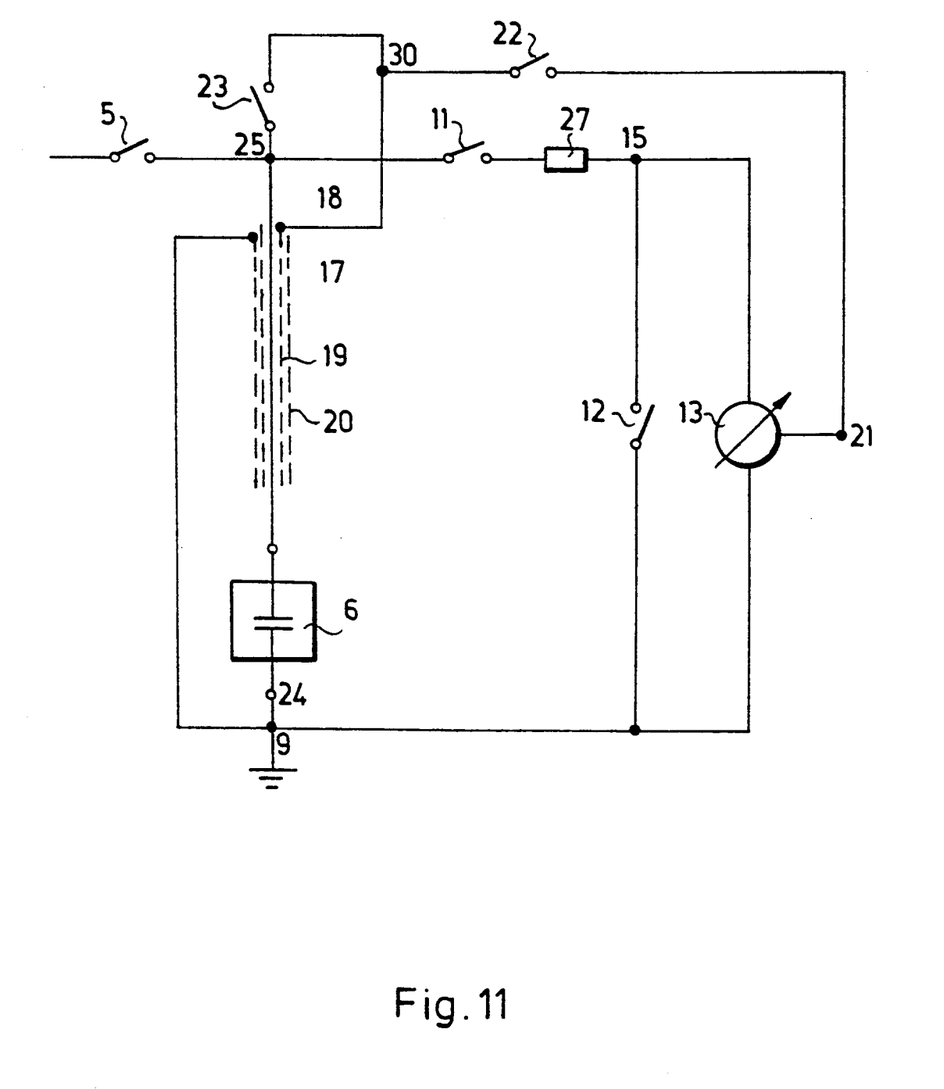
FIG. 11 is a schematic diagram of an alternative embodiment of the circuit.

The circuit of FIG. 11 is a detail of a form of connection between the terminal 25 and the electrode 10 of tested insulation system 6 by use of the inner lead 18 of a double shielded cable 17. The return voltage metering unit 13 consists of an electrometer circuit. Its terminal 21 is connected to the inner shield 19 of the double shielded cable 17 through series switch 22. The outer shield 29 is at ground potential. Switch 23 allows the inner shield to be shorted to the inner lead 18.

This shielded connection is preferable to eliminate interference. At the same time the inner shielding of this design isolates the currents resulting from the cable capacitance of the insulating system 6 which results in increased accuracy of the measurement.

By use of the current meter 26, as shown in FIG. 10, it is possible to measure the current during the charging period, and thus to estimate the insulating resistance and its time function as the ratio of the charging voltage metered by the voltage meter 2 and current. If the charging time is greater than 1 min, it is possible to determine $K_A = R_{60}/R_{10}$ with the same testing apparatus.

The design of the voltage meter 13 of the testing apparatus with an electrometer input provides an input impedance greater than $2 \times 10^{13}$ ohm. This design ensures the accuracy of the measurement with good isolation.

We claim:

1. A method for testing the condition of insulating systems comprising of the steps of:
   a) charging the insulating system to a given direct current voltage level over a charging time period in the range of $10^{-3}$ to $10^4$ seconds;
   b) discharging the insulation system over a discharging time period, wherein the ratio of charging time period to discharging time period is chosen to be in the range of 0.1–100;
   c) determining the peak value of return voltage after discharge and computing the ratio of return voltage to charging voltage;
   d) repeating steps a) through c) at a plurality of charging and discharging time periods in which the ratio thereof remains at said chosen value;
   e) obtaining a spectrum of the return voltage peak charging voltage ratio as a function of charging time; and
   f) comparing said spectrum to a reference spectrum for said system to determine the condition thereof.

2. The method according to claim 1 further including the step of calculating the initial slope of said return voltage for each of said plurality of charging and discharging time period tests; obtaining a spectrum of said return voltage initial slope as a function of charging time; and comparing said slope spectrum to a reference spectrum for said system.

3. The method according to claim 2, wherein said return voltage initial slope is calculated by sampling said return voltage at a sampling period equal to an integral multiple of the ac voltage period to which the insulating system is exposed.

4. Apparatus for implementing the method of claim 1, comprising a high voltage source having a first terminal connected to one side of the insulation system under test and a second terminal connected to the first end of a series of first and second switches, the other end of said series of switches being connected to the second side of the insulation system under test; a shunting switch operatively connected between said first terminal and the intersection of said first and second series switches; return voltage measuring means operatively connected through a series switch to said first and second sides of said insulation system; and a shunting switch across said return voltage measuring means.

5. The apparatus of claim 4, wherein said return voltage measuring means comprises an electrometer coupled to a double-shielded cable, the inner lead of said cable being connected to said second side of said insulation system, the inner shield of said cable being operatively connected said electrometer through a series switch; the first side of said insulation system and the outer shield of said cable being connected to ground.

6. The apparatus of claim 5 further comprising a switch between said cable inner shield and said cable inner lead.

7. The apparatus of claim 4, wherein said return voltage measuring means comprises a voltmeter having an input impedance of at least $2 \times 10^{13}$ ohm.

8. The apparatus of claim 4 further comprising a current meter in series between said first high voltage terminal and said one side of said insulation system.

9. The apparatus of claim 4, wherein each of said switches are solid state switches.

* * * * *

UNITED STATES PATENT AND TRADEMARK OFFICE
CERTIFICATE OF CORRECTION

PATENT NO. : 5,150,059
DATED : September 22, 1992
INVENTOR(S) : Alajos Bognár et al.

It is certified that error appears in the above-identified patent and that said Letters Patent is hereby corrected as shown below:

On the title page, Item [75] change the list of inventors, by adding the following two names --Janos Schmidt, László Kalocsai--.

Signed and Sealed this

Fourteenth Day of September, 1993

Attest:

BRUCE LEHMAN

Attesting Officer

Commissioner of Patents and Trademarks